(12) United States Patent
Shiga et al.

(10) Patent No.: US 8,036,034 B2
(45) Date of Patent: Oct. 11, 2011

(54) SEMICONDUCTOR STORAGE DEVICE EQUIPPED WITH A SENSE AMPLIFIER FOR READING DATA AND THRESHOLD-VOLTAGE-INFORMATION DATA

(75) Inventors: Hitoshi Shiga, Yokohama (JP); Yoshihisa Kondo, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 12/564,425

(22) Filed: Sep. 22, 2009

(65) Prior Publication Data

US 2010/0124110 A1    May 20, 2010

(30) Foreign Application Priority Data

Nov. 14, 2008    (JP) ................................ 2008-291808

(51) Int. Cl.
    *G11C 16/26*    (2006.01)
(52) U.S. Cl. ......... 365/185.09; 365/185.17; 365/185.12; 365/185.03; 365/185.21; 365/185.19
(58) Field of Classification Search ............. 365/185.02, 365/185.03, 185.09, 185.11, 185.12, 185.17, 365/185.21, 185.19, 185.18
See application file for complete search history.

(56) References Cited

U.S. PATENT DOCUMENTS

| 7,031,210 | B2 * | 4/2006 | Park et al. | ..................... 365/201 |
| 2008/0055990 | A1 | 3/2008 | Ishikawa et al. | |
| 2010/0208519 | A1 * | 8/2010 | Shiga et al. | .............. 365/185.03 |
| 2011/0044103 | A1 * | 2/2011 | Shiga | ....................... 365/185.03 |

OTHER PUBLICATIONS

U.S. Appl. No. 12/706,306, filed Feb. 16, 2010, Shiga, et al.
U.S. Appl. No. 12/838,811, filed Jul. 19, 2010, Shiga.

* cited by examiner

*Primary Examiner* — Andrew Q Tran
(74) *Attorney, Agent, or Firm* — Oblon, Spivak, McClelland, Maier & Neustadt, L.L.P.

(57) ABSTRACT

A semiconductor storage device comprises: a sense amplifier circuit; a first data retaining circuit and a second data retaining circuit configured to retain data and threshold voltage information, the second data retaining circuit output the data and the threshold voltage information to the outside; and a control circuit configured to control operation. The sense amplifier circuit is configured to perform a data-read operation and a threshold-voltage-information read operation at the same time. The control circuit is configured to control read operations so that either one of the data or the threshold voltage information for which a read operation is finished earlier is output from the second data retaining circuit, and the other one of the data or the threshold voltage information for which a read operation is not finished yet is read from a memory cell array and retained in the first data retaining circuit.

20 Claims, 15 Drawing Sheets

FIG. 16

| COMMAND | NAND | I/F | DL0 | DL1 | DL2 | DLX |
|---|---|---|---|---|---|---|
| 30h | init | | | | | |
| | AR | | | | | |
| | BR | | | | | |
| | CR | | | | | |
| | DR | | LO -- | -------- | -------- | -→ LO |
| | ER | LO | | | | |
| | FR | | | MI | | |
| | GR | | | | UP | |
| | end | | | | | |
| 3Fh | | | | MI -- | -------- | -→ MI |
| | | MI | | | | |
| | | | | | | |
| 3Fh | | | | | UP -- | -→ UP |
| C0h-31h | init | | | | | |
| (SB1) | Er1 | UP | | | | |
| | A1 | | | | | |
| | B1 | | | | | |
| | C1 | | | | | |
| | D1 | | | | | |
| | E1 | | | | | |
| | F1 | | | | | |
| | G1 | | | | SB1 | |
| | end | | | | | |
| C1h-31h | init | | | | SB1-- | -→SB1 |
| (SB2A) | Er2A | SB1 | | | | |
| | A2A | | | | | |
| | B2A | | | | | |
| | C2A | | | | | |
| | D2A | | | | | |
| | E2A | | | | | |
| | F2A | | | | | |
| | G2A | | | | SB2A | |
| | end | | | | | |
| C0h-C1h-31h | init | | | | | (SB2A) |
| (SB2B) | Er2B | | | | | |
| | A2B | | | | | |
| | B2B | | | | | |
| | C2B | | | | | |
| | D2B | | | | | |
| | E2B | | | | | |
| | F2B | | | | | |
| | G2B | | | SB2B | | |
| | end | | | | | |
| CBh | (XOR) | | | | SB2 | |
| C0h-C1h-3Fh | | | | | SB2-- | -→SB2 |
| | | SB2 | | | | |
| | | | | | | |

FIG. 18

| COMMAND | NAND | I/F | DL0 | DL1 | DL2 | DLX |
|---|---|---|---|---|---|---|
| 30h | init | | | | | |
| | Er1 | | | | | |
| | AR | | | | | |
| | A1 | | | | | |
| | BR | | | | | |
| | B1 | | | | | |
| | CR | | | | | |
| | C1 | | | | | |
| | DR | | | | | LO |
| | D1 | LO | | | | |
| | ER | | | | | |
| | E1 | | | | | |
| 3Fh | FR | | | | MI | |
| | F1 | | | | MI --→ | MI |
| | GR | MI | | UP | | |
| | G1 | | SB1 | | | |
| | end | | | | | |
| 3Fh | | | | UP -- ---------- --→ | | UP |
| C1h-31h (SB2A) | init | | | | | |
| | Er2A | UP | | | | |
| | A2A | | | | | |
| | B2A | | | | | |
| | C2A | | | | | |
| | D2A | | | | | |
| | E2A | | | | | |
| | F2A | | | | | |
| | G2A | | | | SB2A | |
| | end | | | | | |
| C0h-C1h-31h (SB2B) | init | | SB1 -- ---------- --→ | | | SB1 |
| | Er2B | SB1 | | | | |
| | A2B | | | | | |
| | B2B | | | | | |
| | C2B | | | | | |
| | D2B | | | | | |
| | E2B | | | | | |
| | F2B | | | | | |
| | G2B | | | | | |
| | end | | | SB2B | | |
| CBh | (XOR) | | | | SB2 | |
| C0h-C1h-3Fh | | | | | | SB2 |
| | | SB2 | | | | |

FIG. 19

| COMMAND | NAND | I/F | DL0 | DL1 | DL2 | DLX |
|---|---|---|---|---|---|---|
| 30h | init | | | | | |
| | DR | | | | | LO |
| | end | | | | | |
| 31h | init | | | | | |
| | BR | LO | | | | |
| | FR | | | | MI | |
| | end | | | | | |
| 31h | init | | | | MI ---> MI | |
| | AR | MI | | | | |
| | CR | | | | | |
| | ER | | | | | |
| | GR | | | | UP | |
| | end | | | | | |
| 3Fh | | | | | UP ---> UP | |
| C0h-31h (SB1) | init | | | | | |
| | Er1 | UP | | | | |
| | A1 | | | | | |
| | B1 | | | | | |
| | C1 | | | | | |
| | D1 | | | | | |
| | E1 | | | | | |
| | F1 | | | | | |
| | G1 | | | | SB1 | |
| | end | | | | | |
| C1h-31h (SB2A) | init | | | | SB1 ---> SB1 | |
| | Er2A | SB1 | | | | |
| | A2A | | | | | |
| | B2A | | | | | |
| | C2A | | | | | |
| | D2A | | | | | |
| | E2A | | | | | |
| | F2A | | | | | |
| | G2A | | | | SB2A | |
| | end | | | | | |
| C0h-C1h-31h (SB2B) | init | | | | | (SB2A) |
| | Er2A | | | | | |
| | A2B | | | | | |
| | B2B | | | | | |
| | C2B | | | | | |
| | D2B | | | | | |
| | E2B | | | | | |
| | F2B | | | | | |
| | G2B | | | SB2B | | |
| | end | | | | | |
| CBh | (XOR) | | | | SB2 | |
| C0h-C1h-3Fh | | | | | | SB2 |
| | | SB2 | | | | |

SEMICONDUCTOR STORAGE DEVICE EQUIPPED WITH A SENSE AMPLIFIER FOR READING DATA AND THRESHOLD-VOLTAGE-INFORMATION DATA

CROSS REFERENCE TO RELATED APPLICATIONS

This application is based on and claims the benefit of priority from prior Japanese Patent Application No. 2008-291808, filed on Nov. 14, 2008, the entire contents of which are incorporated herein by reference.

BACKGROUND OF THE INVENTION

1. Field of the Invention

The present invention relates to a semiconductor storage device, and in particular, to a non-volatile semiconductor storage device allowing multiple bits to be stored in one memory cell.

2. Description of the Related Art

NAND-type flash memory is known as one of non-volatile semiconductor storage devices. The NAND-type flash memory has a memory cell array including a plurality of NAND cell units. Each NAND cell unit includes a plurality of memory cells connected in series and two selection transistors connected to both ends thereof.

Each memory cell stores, in an erase state, data "1" having a negative threshold voltage. In a data write operation, electrons are injected into a floating gate to write data "0" having a positive threshold voltage. The NAND-type flash memory may change the threshold voltage only from a lower value to a higher value in a data write operation, and may change the threshold voltage in the reverse direction (from a higher value to a lower value) only by an erase operation on a block basis.

To increase memory capacity, current technology has developed so-called multi-value NAND-type flash memory to store two or more bits of information in one memory cell. For example, when 3 bits are stored in one memory cell, one memory cell involves $2^3=8$ different threshold voltage distributions. If 8-value information is stored in one memory cell, the interval between eight different threshold voltage distributions will be reduced. Thus, incorrect data read will occur in a data-read operation, which may lead to lower data reliability.

This requires an error check and correct (ECC) operation to be performed for correcting any incorrectly read data. The error check and correct operation may control the number of write pulses to be applied by performing a verify operation when writing data to a memory cell (see Japanese Patent Laid-Open No. 2006-12367), or correct data that has been read from a memory cell when reading data.

For a semiconductor storage device where an error check and correct operation is performed in reading data, improved data reliability may be achieved by reading data to be read as well as the threshold voltage information of the relevant memory cell, and adding that information to the read data. As used herein, the term "threshold voltage information" refers to information that indicates where the threshold voltage of a memory cell is positioned in the threshold voltage distribution to which certain data is allocated. Given that operations are separately performed for reading data and threshold voltage information, the read data that has been read by a sense amplifier and retained in a data register is transferred to the outside before the threshold voltage information is read. Since the NAND-type flash memory outputs a large amount of data, there will be some period of time during which threshold voltage information is not read at the time of transferring read data, which could increase the total operating time for reading data and threshold voltage information.

SUMMARY OF THE INVENTION

One aspect of the present invention provides a semiconductor storage device comprising: a memory cell array having a plurality of memory cells, each of the memory cells capable of storing multiple bits of information allocated to a plurality of threshold voltage distributions; a sense amplifier circuit configured to read data stored in the memory cell as well as threshold voltage information indicative of at which position a threshold voltage of the memory cell is positioned in one of the plurality of threshold voltage distributions; a first data retaining circuit configured to retain the data and the threshold voltage information read from the memory cell; a second data retaining circuit configured to retain the data and the threshold voltage information read from the memory cell, and output the data and the threshold voltage information to the outside; and a control circuit configured to control read, write, and erase operations on the memory cell array, the sense amplifier circuit being configured to perform a data-read operation and a threshold-voltage-information read operation at the same time by a series of voltage application operations to a word line connected to the memory cell, the control circuit being configured to control read operations so that either one of the data or the threshold voltage information for which a read operation is finished earlier is output from the second data retaining circuit, and the other one of the data or the threshold voltage information for which a read operation is not finished yet is read from the memory cell array and retained in the first data retaining circuit.

Another aspect of the present invention provides a semiconductor storage device comprising: a memory cell array having a plurality of memory cells, each of the memory cells capable of storing multiple bits of information allocated to a plurality of threshold voltage distributions; a sense amplifier circuit configured to read data stored in the memory cell as well as threshold voltage information indicative of at which position a threshold voltage of the memory cell is positioned in one of the plurality of threshold voltage distributions; a first data retaining circuit configured to retain the data and the threshold voltage information read from the memory cell; a second data retaining circuit configured to retain the data and the threshold voltage information read from the memory cell, and output the data and the threshold voltage information to the outside; and a control circuit configured to control read, write, and erase operations on the memory cell array, the memory cell storing multiple pages of information corresponding to the multiple bits of information, the sense amplifier circuit being configured to perform a data-read operation on a page-by-page basis by applying a voltage to a word line connected to the memory cell, and the control circuit being configured to control a read operation so that the data is output from the second data retaining circuit, and the threshold voltage information is read from the memory cell array and retained in the first data retaining circuit.

Still another aspect of the present invention provides a semiconductor storage device comprising: a memory cell array having a plurality of memory cells, each of the memory cells capable of storing multiple bits of information allocated to a plurality of threshold voltage distributions; a sense amplifier circuit configured to read data stored in the memory cell as well as threshold voltage information indicative of where a threshold voltage of the memory cell is positioned in one of the plurality of threshold voltage distributions; a first data retaining circuit configured to retain the data and the threshold voltage information read from the memory cell; a second data retaining circuit configured to retain the data and the threshold voltage information read from the memory cell, and output the data and the threshold voltage information to the outside; and a control circuit configured to control read, write, and erase operations on the memory cell array, the sense amplifier circuit being configured to perform a data-read operation by applying a voltage to a word line connected to the memory cell, and the control circuit being configured to control a read operation so that the data is output from the second data retaining circuit, and threshold voltage information is read from the memory cell array and retained in the first data retaining circuit.

BRIEF DESCRIPTION OF THE DRAWINGS

FIG. 16 is a diagram for explaining the operations of respective parts, where a data-read operation and a threshold-voltage-information read operation are performed according to the comparative example;

FIG. 18 is a diagram for explaining the operations of respective parts, where a data-read operation and a threshold-voltage-information read operation are performed according to the first embodiment; and FIG. 19 is a diagram for explaining the operations of respective parts, where a data-read operation and a threshold-voltage-information read operation are performed according to a second embodiment.

DETAILED DESCRIPTION OF THE EMBODIMENTS

Embodiments of the present invention will now be described below with reference to the accompanying drawings.

First Embodiment

Figure 1:
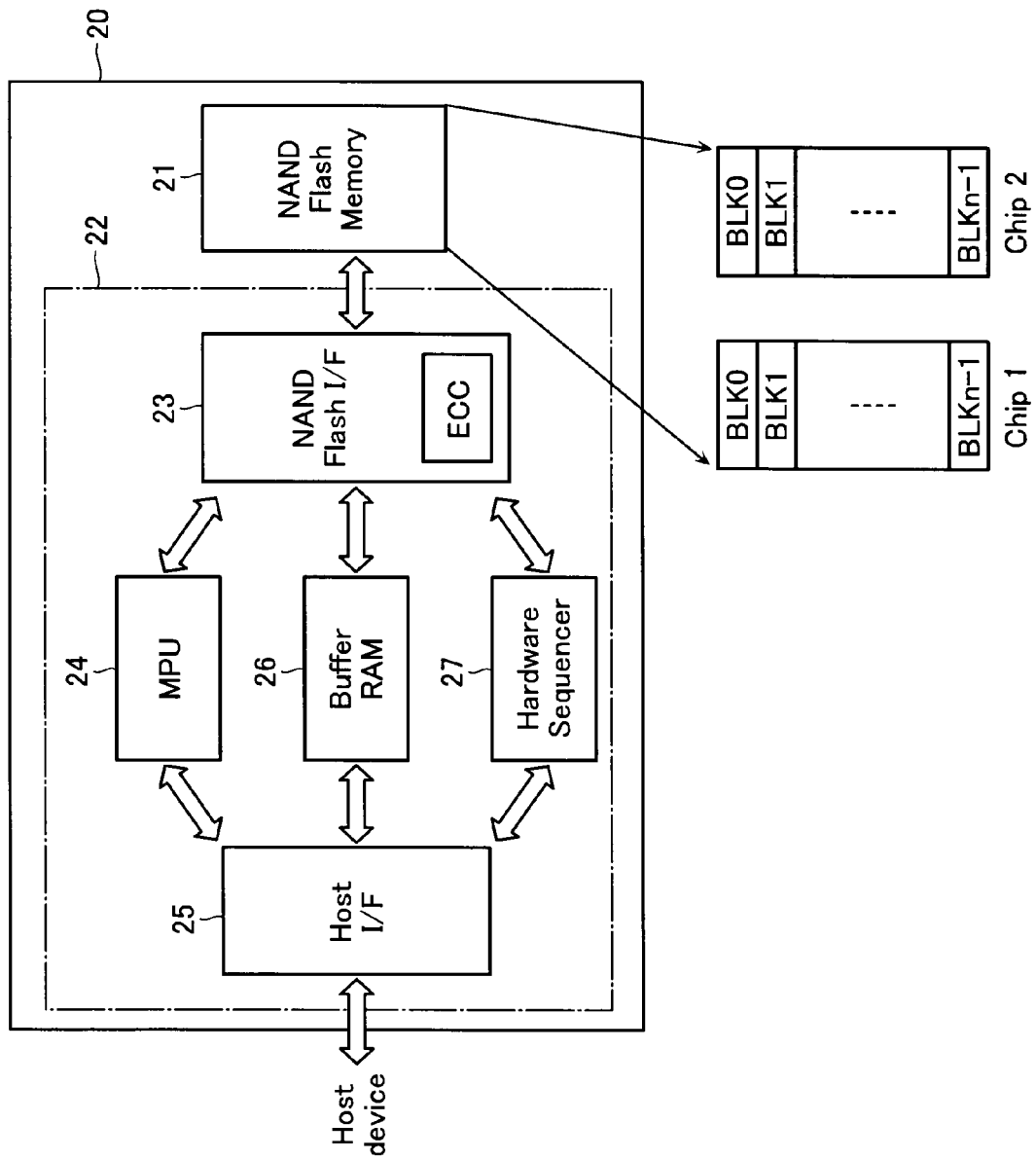
FIG. 1 is a block diagram illustrating a general configuration of a memory card 20, which represents a non-volatile semiconductor storage device according to a first embodiment.

Referring first to FIG. 1 and the like, a semiconductor storage device according to a first embodiment of the present invention will be described below.

[System Overview]

FIG. 1 is a block diagram illustrating a general configuration of a memory card 20, which represents the non-volatile semiconductor storage device according to the first embodiment. The memory card 20 configures modules with a NAND-type flash memory chip 21 and a memory controller 22 that controls read/write operations of the NAND-type flash memory chip 21. The flash memory chip 21 may be a plurality of memory chips. Although FIG. 1 illustrates two memory chips, i.e., chip 1 and chip 2, they are also controlled by the single memory controller 22. The memory controller 22 is a one-chip controller that has a NAND flash interface 23 for transferring data to and from the memory chip 21, an MPU 24 for controlling, not only data transfer, but also entire operations in the memory card, a host interface 25 for transferring data to and from a host device, a buffer RAM 26 for temporarily retaining read/write data, etc., and a hardware sequencer 27 for use in, e.g., sequence control of read/write of firmware (FW) within the memory chip 21.

When the memory card 20 is powered on, an initializing operation (power-on initial setup operation) is performed to automatically read firmware (control program) stored in the memory chip 21. The firmware (control program) is transferred to the data register (buffer RAM) 26. This read control operation is performed by the hardware sequencer 27.

Using the firmware loaded on the buffer RAM 26, the MPU 24 creates tables on the buffer RAM 26, accesses the memory chip 21 in response to commands from the host device, controls data transfer, and so on. In addition, the NAND flash interface 23 comprises an ECC circuit for performing error correction on read data, based on redundant data that is stored in the memory chip 21.

Figure 2:
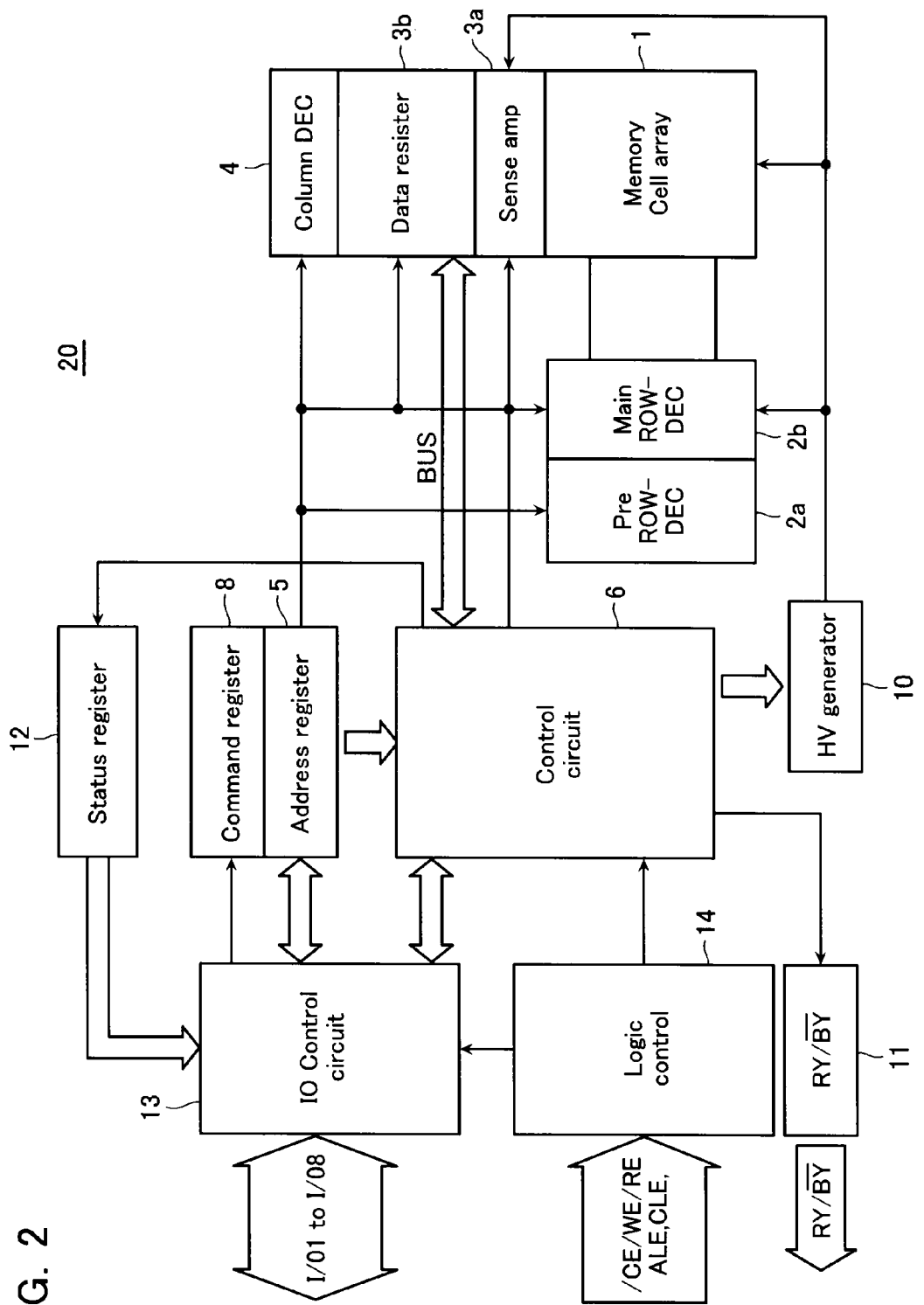
FIG. 2 is a functional block diagram where a logic control is described in an integrated manner for the memory chip 21 and the controller 22 of the memory card 20 of FIG. 1.

However, it is not essential for the present memory system that the memory chip 21 and the controller chip are separate chips. FIG. 2 illustrates a configuration of functional blocks where a logic control is described in an integrated manner for the memory chip 21 and the controller 22 of the memory card 20 of FIG. 1. In addition, FIG. 3 illustrates a configuration of a cell array in the memory core portion.

Figure 3:
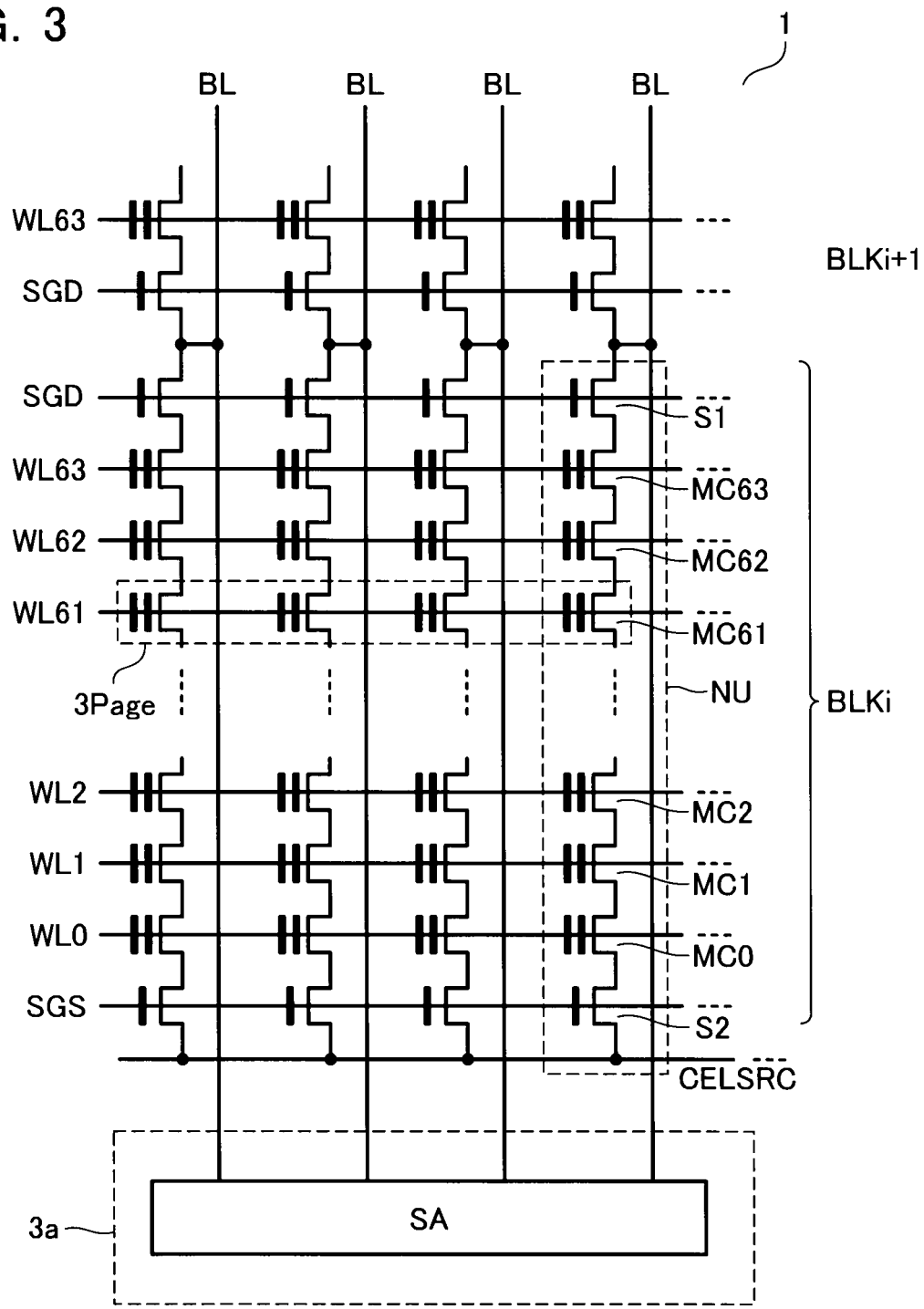
FIG. 3 is a circuit diagram illustrating a specific configuration of the memory cell array 1.

As illustrated in FIG. 3, a memory cell array 1 includes NAND cell units (NAND strings) NU arranged therein, each of which has a plurality of electrically rewritable non-volatile memory cells (in FIG. 3, 64 memory cells) MC0-MC63 connected in series. A plurality of NAND cell units NU together form one block BLK, sharing the corresponding word lines WL.

One block BLK forms one unit for data erase operation. In addition, when 3 bits of data are stored in one memory cell MC (3 bits per cell), three pages (upper page UPPER, middle page MIDDLE, and lower page LOWER) of data are stored by those memory cells MC that are formed along one word line WL. The number of word lines WL included in one block BLK in one memory cell array 1 is 64, and the number of pages included in one block is 64×3=192.

As illustrated in FIG. 3, one end of each of the NAND cell units NU is connected via a selection gate transistor S1 to a respective bit line BL, and the other end connected via a selection gate transistor S2 to a common source line CELSRC. The gates of the selection gate transistors S1, S2 are connected to respective selection-gate lines SGD, SGS. In addition, the control gates of the memory cells MC0 to MC63 are connected to respective word lines WL0 to WL63.

A sense amplifier 3*a*, which is utilized to read and write cell data, is positioned at one end of each of the bit lines BL. A row decoder 2 (not illustrated in FIG. 3), which selectively drives each word line and selection-gate line, is positioned at one end of each of the word lines WL.

As illustrated in FIG. 2, commands, addresses and data are input via an I/O control circuit 13. In addition, chip-enable signals /CE, write-enable signals /WE, read-enable signals /RE, and other external control signals are input to a logic circuit 14 for timing control. Commands are decoded at a command register 8.

A control circuit 6 controls data transfer and performs write/erase/read sequence control. A status register 11 outputs Ready/Busy states of the memory card 20 to a Ready/Busy terminal. In addition to this, a status register 12 is also provided that informs the host of the states of the memory 20 (Pass/Fail, Ready/Busy, and so on) via an I/O port.

Addresses are transferred via an address register 5 to the row decoder 2 (including a pre row decoder 2*a* and a main row decoder 2*b*) or a column decoder 4. Write data is loaded on a sense amplifier circuit 3 (including a sense amplifier 3*a* and a data register 3*b*) via the I/O control circuit 13 over the control circuit 6 through a data bus BUS. Read data is output via the control circuit 6 to the outside.

A high-voltage generation circuit 10 is provided for generating a high voltage required for each mode of operation. The high-voltage generation circuit 10 generates a certain high voltage based on orders from the control circuit 6.

Figure 4:
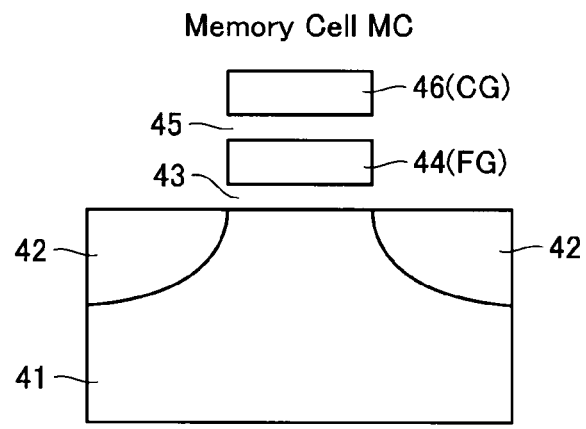
FIG. 4 is a cross-sectional view illustrating a configuration of one memory cell MC.
Figure 5:
FIG. 5 is a cross-sectional view illustrating a configuration of selection transistors S1 and S2.
Figure 5:
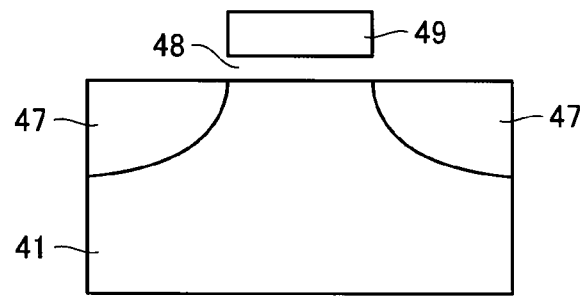

FIGS. 4 and 5 illustrate cross-sectional structures of one memory cell MC as well as selection gate transistors S1 and S2, respectively. N-type diffusion layers 42 are formed on a substrate 41 that function as the source and drain of a MOSFET included in the memory cell MC. In addition, a floating gate (FG) 44 is formed on the substrate 41 via a gate insulation film 43. A control gate (CG) 46 is formed on the floating gate 44 via an insulation film 45.

Each of the selection gate transistors S1 and S2 comprises the substrate 41 and n-type diffusion layers 47 formed on the substrate 41 as its source and drain. A control gate 49 is formed on the substrate 41 via a gate insulation film 48.

Figure 6:
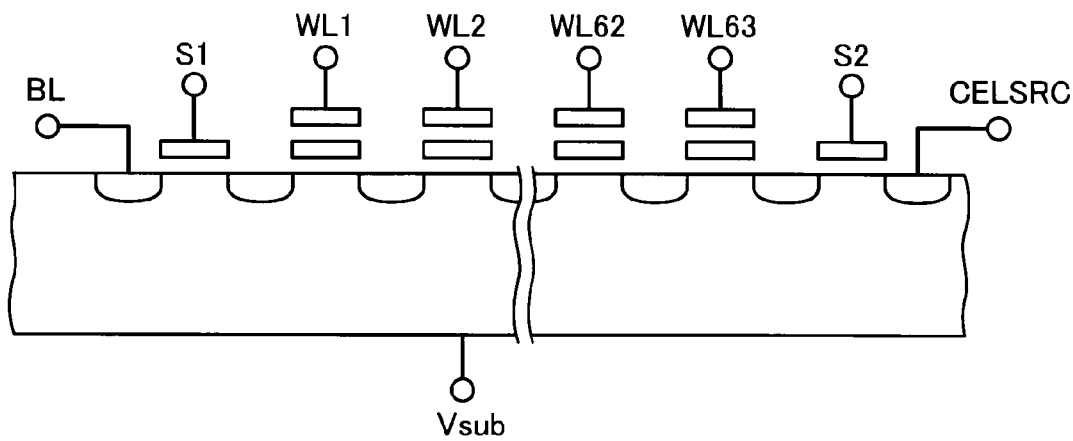
FIG. 6 is a cross-sectional view illustrating a configuration of one NAND cell unit NU.

FIG. 6 illustrates a cross section of one NAND cell unit NU of the memory cell array 1. In this example, one NAND cell unit NU includes 64 memory cells MC configured as illustrated in FIG. 4, which memory cells are connected in series. Provided at the drain and source sides of the NAND cell unit NU are a first selection gate transistor S1 and a second selection gate transistor S2 configured as illustrated in FIG. 5.

[Multi-Value Storage Operation in NAND-Type Flash Memory]

A multi-value storage operation will now be described below that is performed in the NAND-type flash memory configured according to this embodiment. In the NAND-type flash memory, the value of threshold voltage may be controlled in eight different ways for one memory cell to cause 3 bits of data to be stored in one memory cell.

Figure 7:
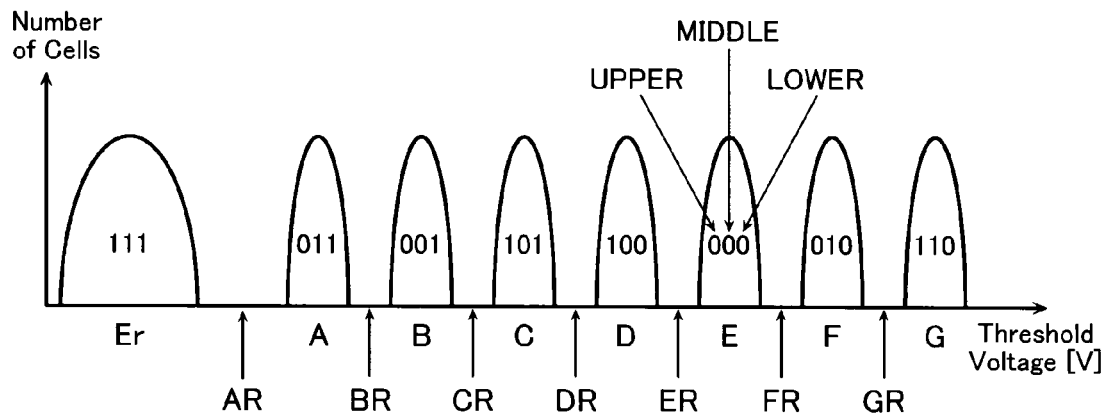
FIG. 7 illustrates the states of threshold voltage distributions (the relation between the threshold voltage Vth and the number of cells) where 3 bits of information are stored in one memory cell.

FIG. 7 illustrates the states of threshold voltage distributions (the relation between a threshold voltage and the number of cells) where 3 bits of information are stored in one memory cell. To store 3 bits of information, eight different threshold voltage distributions (Er, and A to G) are provided corresponding to eight different kinds of data, "111", "011", "001", "101", "100", "000", "010", "110", for writing and reading information. That is, any one of eight different kinds of bit information (111, and 011 to 010) is allocated to each of the eight different threshold voltage distributions (Er, and A to G), respectively. Three sub-pages are formed corresponding to the 3 bits of data: upper page UPPER, middle page MIDDLE, and lower page LOWER.

The operation for reading these eight different kinds of data is performed by applying a read voltage to a selected word line WL connected to the memory cell MC to detect whether the memory cell MC is conductive or not conductive. Corresponding to the eight different threshold voltage distributions of the relevant memory cell, the voltage values of read voltage applied to the selected word line may be set to voltages AR, BR, CR, DR, ER, FR, and GR (seven different voltages) between the threshold voltage distributions. The lowest read voltage is AR, and the voltage value increases in order of: BR, CR, DR, ER, FR, and GR. Note that the voltage to be applied to an unselected memory cell MC in read operation is set to be greater than that for the threshold voltage distribution G to which data "110" is allocated.

Given that multi-value (e.g., 8-value) information is stored in one memory cell, the interval between eight different threshold voltage distributions will be reduced. Thus, incorrect data read will occur in a data-read operation, which may lead to lower data reliability. This would require an error check and correct (ECC) operation to be performed for correcting any incorrectly read data. When performing an error check and correct operation, it can be performed with high accuracy by reading threshold voltage information of the relevant memory cell MC, in addition to the data to be read, and adding that information to the read data. As used herein, the term "threshold voltage information" refers to such information that indicates where the threshold voltage value of a memory cell MC is positioned in one of the threshold voltage distributions (Er, and A to G) (e.g., whether positioned near the center or on the right side or left side of the threshold voltage distribution A, and so on). In other words, the threshold voltage information indicates the "likelihood" of read data. The threshold voltage information is set in two different ways, which will be discussed in detail below. In the following description, two kinds of threshold voltage information that are set in different ways are referred to as first threshold voltage information and second threshold voltage information, respectively.

Hereinafter, data-read operation, first threshold-voltage-information read operation, and second threshold-voltage-information read operation from a memory cell MC in which multi-value data is stored will be described below. Thereafter, reference will be made to how these operations are controlled by the semiconductor storage device according to this embodiment.

[Data-Read Operation]

Figure 8:
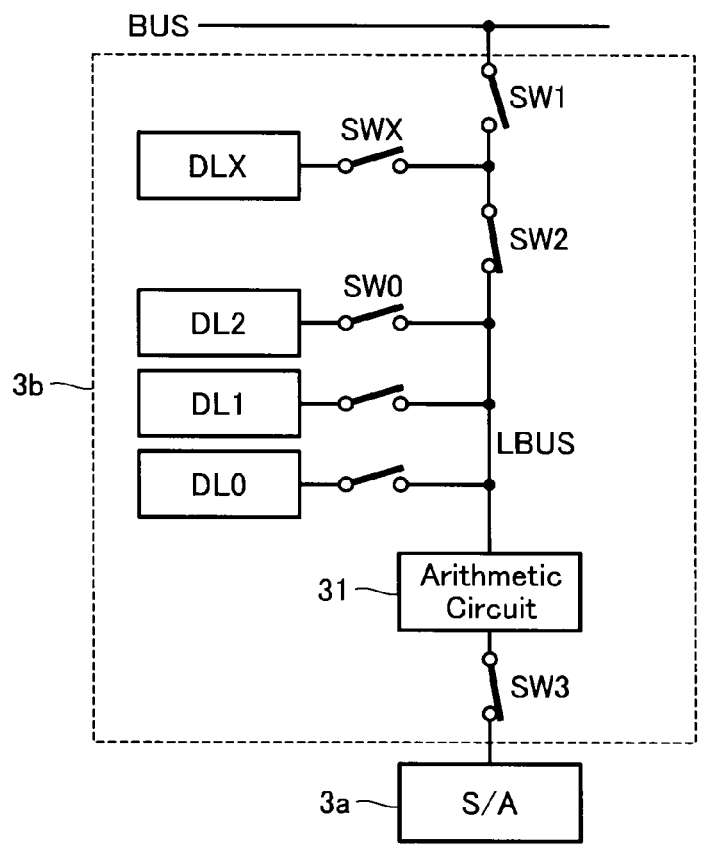
FIG. 8 is a block diagram illustrating a configuration of a sense amplifier 3a and a data register 3b that are included in a sense amplifier circuit 3.

A configuration of the sense amplifier circuit 3 will be described below for reading data from a memory cell MC having eight different threshold voltage distributions (Er, and A to G). FIG. 8 illustrates the configuration of a sense amplifier 3a and a data register 3b included in a sense amplifier circuit 3.

The data register 3b includes an arithmetic circuit 31 that performs logical operations on data read by the sense amplifier 3a, and four data latches DL0, DL1, DL2, DLX, each of which temporarily retains data output from the arithmetic circuit 31. The data latches DL0, DL1, and DL2 are connected via respective switches SW0 to a local bus LBUS in the data register 3b, through which data input/output operations are performed.

In addition, the data register 3b is provided with a switch SW1 that connects the data register 3b to the data bus BUS, a switch SW2 that connects the local bus LBUS to which the data latches DL0 to DL2 are connected to the data latch DLX, and a switch SW3 that connects the sense amplifier 3a to the arithmetic circuit 31. The switches SW1 and SW2 are controlled to operate in a complementary manner such that one will be opened while the other being closed. A switch SWX is closed at the same time as any of the switches SW1 or SW2 being closed to connect the data latch DLX to any of the local bus LBUS or data bus BUS.

The arithmetic circuit 31 has functions for performing logical operations between data detected by the sense amplifier 3a and data retained by the data latches DL, as well as logical operations on data retained by multiple data latches DL, and for transferring the operation results to the data latches DL. In addition, the data latch DLX may communicate data with the outside through the data bus BUS by turning the switch SW2 off and the switch SW1 on.

The data register 3b of this embodiment retain read data in the data latch DLX. Then, the data register 3b may turn the switch SW2 off and the switch SW1 on to output data that is retained in the data latch DLX to the outside. At the same time, the next read operation may be performed using the sense amplifier 3a and the data latches DL0 to DL2.

Figure 9:
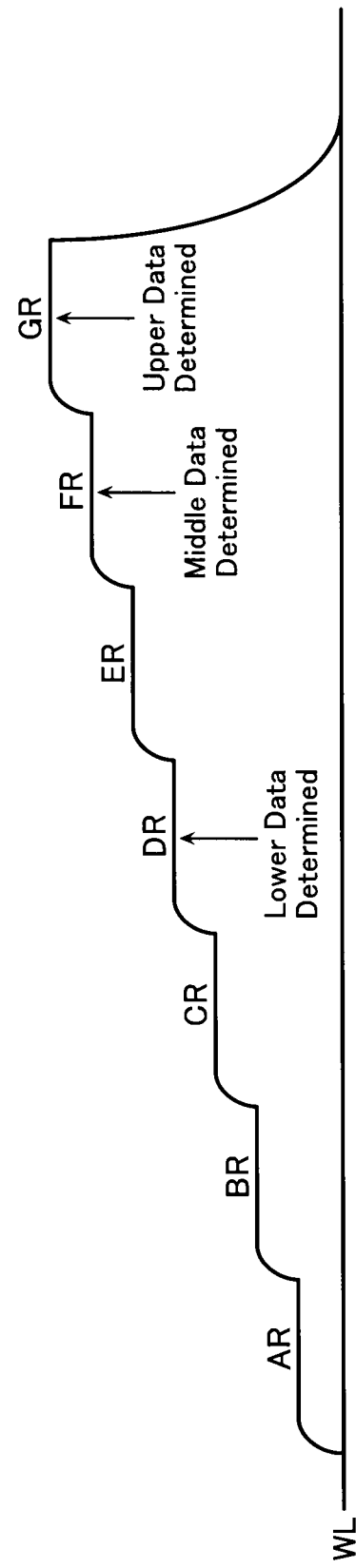
FIG. 9 illustrates a waveform of voltages applied to the word line of the selected memory cell when reading data.
Figure 10:
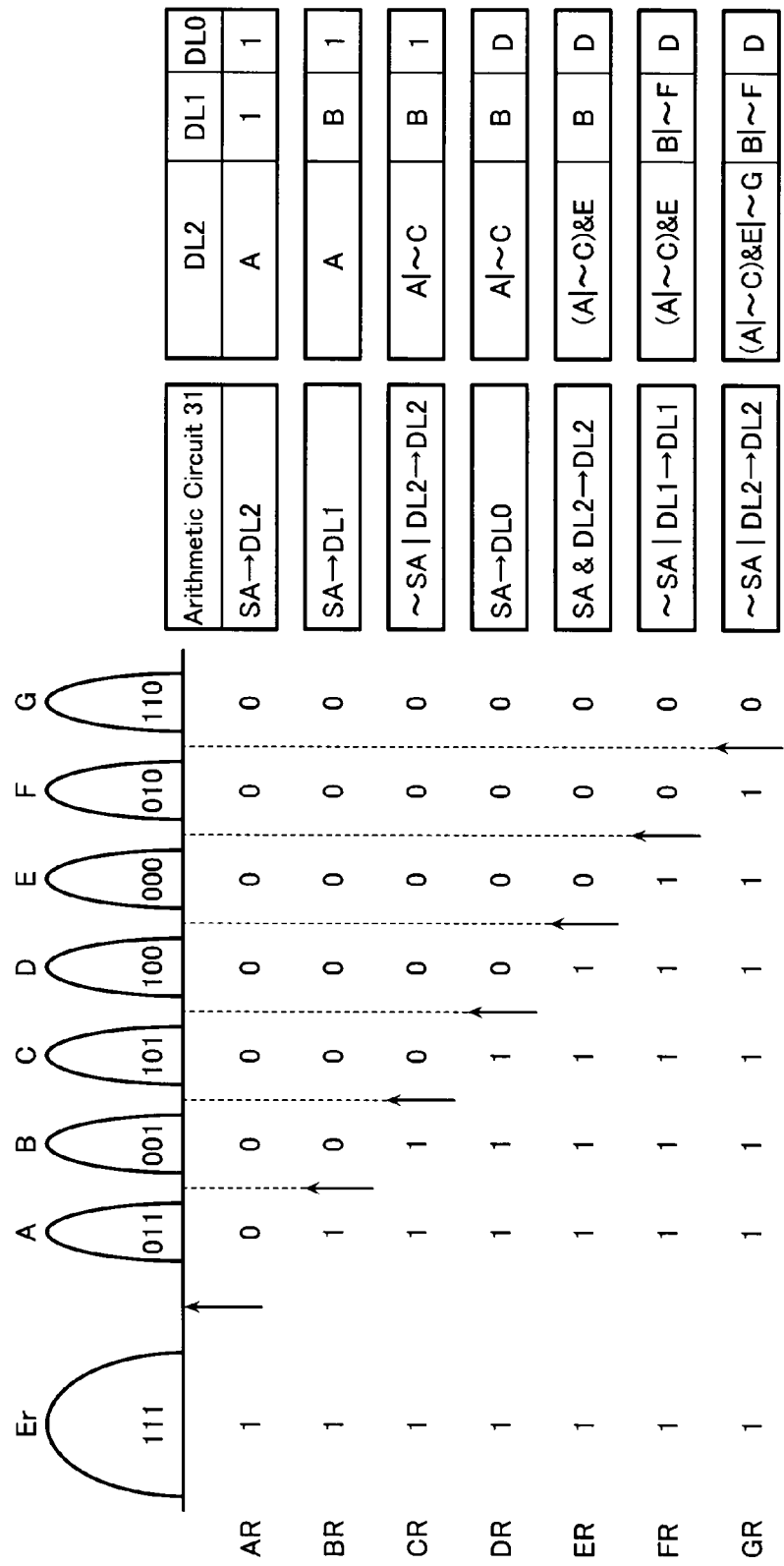
FIG. 10 illustrates the arithmetic operations performed by the arithmetic circuit as well as data retained in the data latches when reading data.

A data-read operation using the sense amplifier circuit 3 will now be outlined below. In this case, it is assumed that first threshold voltage information and second threshold voltage information are not read, which will be discussed in detail below. FIG. 9 illustrates a waveform of voltages applied to the word line WL of the selected memory cell MC when reading data. FIG. 10 illustrates the arithmetic operations performed by the arithmetic circuit 31 as well as the data retained in the data latches when reading data.

As mentioned above, the read voltage is set to respective voltages AR, BR, CR, DR, ER, FR, and GR (seven different voltages) between the threshold voltage distributions, corresponding to eight different threshold voltage distributions of the memory cell. As illustrated in FIG. 9, once a read operation has started, seven different read voltages AR, BR, CR, DR, ER, FR, and GR are applied to the selected word line WL in the stated order (the lower voltage AR is applied first, and then voltages are applied in order of: BR, CR, DR, ER, FR, and GR). In this case, it is assumed that "1" data is retained in all of the data latches DL0 to DL2 when the read operation starts.

As illustrated in FIG. 10, when the read voltage AR is applied, only a memory cell MC becomes conductive that has the threshold voltage distribution Er (data "111") in an erase state with the lowest threshold voltage, in which case "1" data is detected by the sense amplifier 3a. The other memory cells MC do not become conductive, and "0" data is detected by the sense amplifier 3a. The arithmetic circuit 31 transfers the data detected by the sense amplifier 3a as is to the data latch DL2. The data latch DL2 retains the "1" or "0" data that has been read with the read voltage AR.

Then, when the read voltage BR is applied, those memory cells MC become conductive that have the threshold voltage distributions Er and A, in which case "1" data is detected by the sense amplifier 3a. The other memory cells MC do not become conductive, and "0" data is detected by the sense amplifier 3a. The arithmetic circuit 31 transfers the data detected by the sense amplifier 3a as is to the data latch DL1. The data latch DL1 retains the "1" or "0" data that has been read with the read voltage BR.

Then, when the read voltage CR is applied, those memory cells MC become conductive that have the threshold voltage distributions Er, A, and B, in which case "1" data is detected by the sense amplifier 3a. The other memory cells MC do not become conductive, and "0" data is detected by the sense amplifier 3a. The arithmetic circuit 31 performs a logical OR between the data resulting from inverting the data detected by the sense amplifier 3a and the data retained in the data latch DL2, the result of which is transferred to the data latch DL2. The data latch DL2 retains the operation result, "1" or "0" data.

Then, when the read voltage DR is applied, those memory cells MC become conductive that have the threshold voltage distributions Er, A, B, and C, in which case "1" data is detected by the sense amplifier 3a. The other memory cells MC do not become conductive, and "0" data is detected by the sense amplifier 3a. The arithmetic circuit 31 transfers the data detected by the sense amplifier 3a as is to the data latch DL0. The data latch DL0 retains the "1" or "0" data that has been read with the read voltage DR.

Upon completion of the read operation with the read voltage DR, data of the lower page LOWER is determined and retained in the data latch DL0. Hereafter, the data in the data latch DL0 will not change.

Then, when the read voltage ER is applied, those memory cells MC become conductive that have the threshold voltage distributions Er, A, B, C, and D, in which case "1" data is detected by the sense amplifier 3a. The other memory cells MC do not become conductive, and "0" data is detected by the sense amplifier 3a. The arithmetic circuit 31 performs a logical AND between the data detected by the sense amplifier 3a and the data retained in the data latch DL2, the result of which is transferred to the data latch DL2. The data latch DL2 retains the operation result, "1" or "0" data. Then, when the read voltage FR is applied, those memory cells MC become conductive that have the threshold voltage distributions Er, A, B, C, D, and E, in which case "1" data is detected by the sense amplifier 3a. The other memory cells MC do not become conductive, and "0" data is detected by the sense amplifier 3a. The arithmetic circuit 31 performs a logical OR between the data resulting from inverting the data detected by the sense amplifier 3a and the data retained in the data latch DL1, the result of which is transferred to the data latch DL1. The data latch DL1 retains the operation result, "1" or "0" data.

Upon completion of the read operation with the read voltage FR, data of the middle page MIDDLE is determined and retained in the data latch DL1. Hereafter, the data in the data latch DL1 will not change.

Finally, when the read voltage GR is applied, those memory cells MC become conductive that have the threshold voltage distributions Er, A, B, C, D, E, and F, in which case "1" data is detected by the sense amplifier 3a. The other memory cells MC do not become conductive, and "0" data is detected by the sense amplifier 3a. The arithmetic circuit 31 performs a logical OR between the data resulting form inverting the data detected by the sense amplifier 3a and the data retained in the data latch DL2, the result of which is transferred to the data latch DL2. The data latch DL2 retains the operation result, "1" or "0" data.

Upon completion of the read operation with the read voltage GR, data of the upper page UPPER is determined and retained in the data latch DL2.

According to the sense amplifier circuit 3 of this embodiment, a series of read operations using three data latches DL and the arithmetic circuit 31 allow data of three sub-pages (upper page UPPER, middle page MIDDLE, and lower page LOWER) to be read at the same time from the selected memory cell MC.

[First Threshold-Voltage-Information Read]

Figure 11:
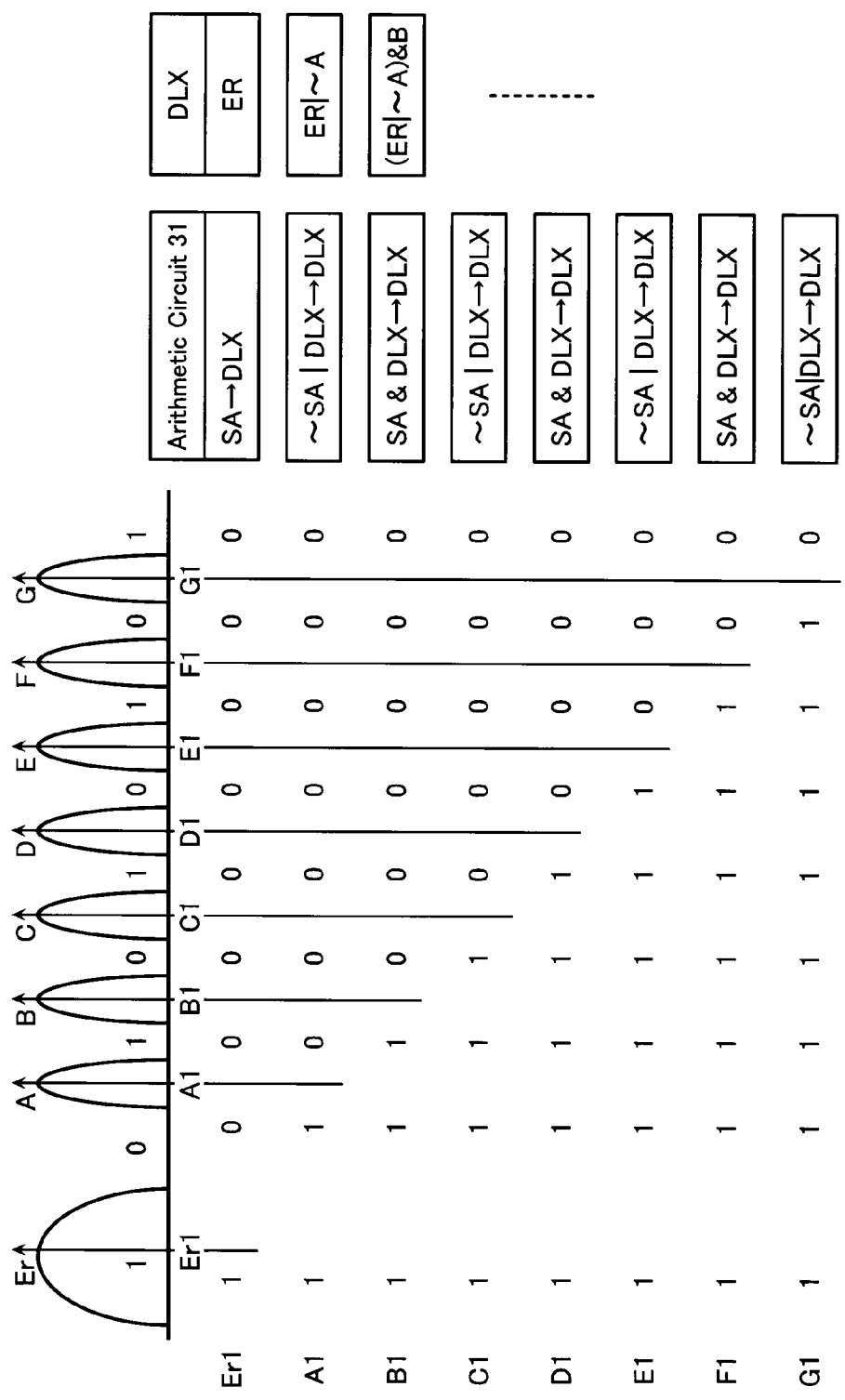
FIG. 11 illustrates the voltage applied to the word line of the selected memory cell as well as the operations of the arithmetic circuit and the data latches when reading threshold voltage information.

A first threshold-voltage-information read operation in the NAND-type flash memory will now be described below. FIG. 11 illustrates the voltages applied to the word line WL of the selected memory cell MC as well as the operations of the arithmetic circuit 31 and the data latch DL when reading first threshold voltage information.

If three pages of data are collectively read by the above-mentioned data-read operation, it is determined to which threshold voltage distributions Er, and A to G the data retained in a memory cell MC belong. In data reading from a memory cell MC storing multi-value data, the memory cell MC having a certain threshold voltage distribution could be erroneously read as having the adjacent threshold voltage distribution. For example, when data is read from a memory cell MC as a threshold voltage distribution C, there is a possibility that the memory cell MC in fact retains data corresponding to a threshold voltage distribution B or D, and the data has been erroneously read as C.

However, it is unlikely that a memory cell MC having the threshold voltage distribution A or E, for example, is erroneously read as storing data corresponding to the threshold voltage distribution C that is not adjacent to the threshold voltage A or E but more distant than the adjacent one (B or D).

The data read from a memory cell MC is corrected by an error check and correct operation performed in the ECC circuit. In this case, threshold voltage information (first threshold voltage information, and second threshold voltage information described below) is utilized to perform accurate error check and correct operations.

As illustrated in FIG. 11, in a first threshold-voltage-information read operation, first-threshold-voltage-information reading voltages Er1, A1, B1, C1, D1, E1, F1, and G1 are sequentially applied to the selected word line WL. The first-threshold-voltage-information reading voltages are positioned near the center of (between the left and right ends of) respective eight different threshold voltage distributions Er, and A to G retained by the memory cell MC. With these voltages, a logical operation is performed at the arithmetic circuit 31 based on whether or not the memory cell MC becomes conductive, thereby determining first-threshold-voltage information "1" or "0". The first-threshold-voltage information resulting from the logical operation is illustrated as "0" data or "1" data, which is allocated as illustrated at the top of FIG. 11 together with the threshold voltage distributions Er and A-G. For example, if a certain memory cell MC has a threshold voltage of not less than the first-threshold-voltage-information reading voltage C1 and not more than the first-threshold-voltage-information reading voltage D1, then the memory cell MC is provided with first threshold voltage information "1".

For example, it is assumed here that a memory cell MC is read in a data-read operation and determined as storing data corresponding to the threshold voltage distribution C. In addition, this memory cell MC is determined as "1" data in a first threshold-voltage-information read operation (i.e., positioned on the right side of the threshold voltage distribution C). In this case, this memory cell MC may indeed store the data of the threshold voltage distribution C, or may actually retain data of the threshold voltage distribution D, but is read as C due to erroneous reading. On the other hand, it can be said that there is a small possibility that this memory cell MC stores data of the threshold voltage distribution B or the other distributions (other than C and D), but is read as C due to erroneous reading.

In addition, it is assumed here that a memory cell MC is read in a data-read operation and determined as storing data corresponding to the threshold voltage distribution C. In addition, this memory cell MC is determined as "0" data in a first threshold-voltage-information read operation (i.e., positioned on the left side of the threshold voltage distribution C). In this case, the memory cell MC may indeed store the data of the threshold voltage distribution C, or may actually store data of the threshold voltage distribution B, but is read as C due to erroneous reading. On the other hand, it can be said that there is a small possibility that this memory cell MC stores data of the threshold voltage distribution D or other distributions (other than C and B), but is read as C due to erroneous reading. Performing error check and correct operations with first threshold voltage information may improve the accuracy of error check and correct operation.

Referring now to FIG. 11, specific procedures of the first threshold-voltage-information read operation according to this embodiment will be described below.

As illustrated in FIG. 11, when reading first threshold voltage information, the voltage values of read voltage applied to the selected word line WL may be set to voltages Er1, A1, B1, C1, D1, E1, F1, and G1 that represent substantially intermediate voltages of respective eight different threshold voltage distributions Er, and A to G retained by a memory cell MC. Once the first threshold-voltage-information read operation starts, the voltages Er1 to G1 are sequentially applied to the word line WL in increasing order. It is assumed herein that a data latch to retain threshold voltage information is the data latch DLX.

When the voltage Er1 is applied, the memory cell MC becomes conductive if it has a threshold voltage that is positioned on the left side (negative side) of the threshold voltage distribution Er having the lowest threshold voltage, in which case "1" data is detected by the sense amplifier 3a. The memory cell MC does not become conductive if the memory cell MC has a threshold voltage that is positioned on the right side of the threshold voltage distribution Er or in the other threshold voltage distributions A to G, in which case "0" data is detected by the sense amplifier 3a. The arithmetic circuit 31 transfers the data detected by the sense amplifier 3a as is to the data latch DLX. The data latch DLX retains the transferred "1" or "0" data.

Then, when the voltage A1 is applied, the memory cell MC becomes conductive if the memory cell MC has a threshold voltage that is positioned on the threshold voltage distribution Er or on the left side (negative side) of the threshold voltage distribution A, in which case "1" data is detected by the sense amplifier 3a. The memory cell MC does not become conductive if it has a threshold voltage that is positioned in the other threshold voltage distributions, in which case "0" data is detected by the sense amplifier 3a. The arithmetic circuit 31 performs a logical OR between the data resulting from inverting the data detected by the sense amplifier 3a and the data retained in the data latch DLX, the result of which is transferred to the data latch DLX. The data latch DLX retains the operation result, "1" or "0" data.

Then, when the voltage B1 is applied, the memory cell MC becomes conductive if the memory cell MC has a threshold voltage that is positioned on the threshold voltage distributions Er and A, or on the left side (negative side) of the threshold voltage distributions B, in which case "1" data is detected by the sense amplifier 3a. The memory cell MC does not become conductive if it has a threshold voltage that is positioned in the other threshold voltage distributions, in which case "0" data is detected by the sense amplifier 3a. The arithmetic circuit 31 performs a logical AND between the data detected by the sense amplifier 3a and the data retained in the data latch DLX, the result of which is transferred to the data latch DLX. The data latch DLX retains the operation result, "1" or "0" data.

Thereafter, the voltages C1 to G1 are sequentially applied in a similar manner and the arithmetic circuit 31 performs a logical operation on the first threshold voltage information, the result of which is transferred to the data latch DLX. Through the first threshold-voltage-information read operation, "1" data or "0" data which is allocated as illustrated at the top of FIG. 11 is determined as the first threshold voltage information based on the threshold voltage held by the memory cell MC. This threshold-voltage-information read operation may be performed using one data latch and the arithmetic circuit 31. Any of the data latches DL0 to DL2 may be used as one data latch.

[Second Threshold-Voltage-Information Read Operation]

Figure 12:
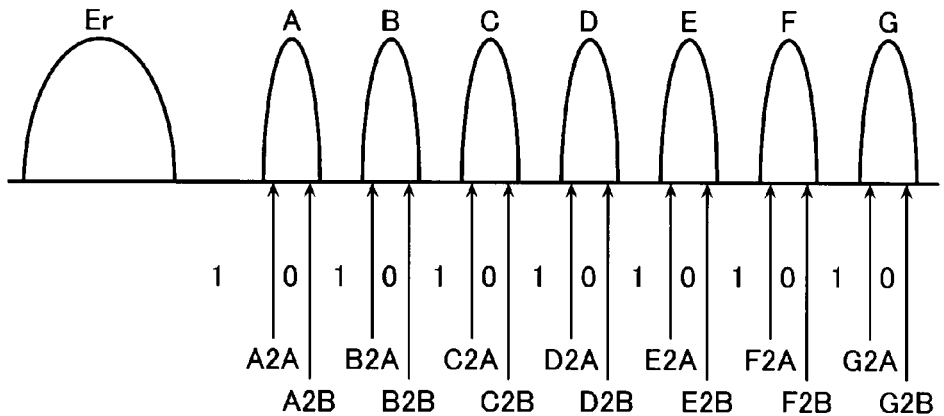
FIG. 12 illustrates the voltage applied to the word line of the selected memory cell when reading second threshold voltage information.

A second threshold-voltage-information read operation according to this embodiment will now be described below. FIG. 12 illustrates the voltages applied to the selected word line WL of the selected memory cell MC when reading second threshold voltage information.

In second threshold-voltage-information read operation, voltages A2A, A2B, B2A, B2B, . . . , G2A, and G2B are applied to a word line WL. The voltages are incremented or decremented from the lower or upper limit of eight different threshold voltage distributions Er, and A to G retained by a memory cell MC, by a voltage which is substantially on the order of one-fourth of the width of respective threshold voltage distributions. As used herein, the term "upper limit" and "lower limit" refer to the upper and lower limits of the threshold distribution provided immediately after data is written to a memory cell. It is assumed that the upper and lower limits should not overlap any other threshold distributions. With these voltages, a logical operation is performed at the arithmetic circuit 31 based on whether or not the memory cell MC becomes conductive, thereby determining second threshold voltage information "1" or "0". For example, if a certain memory cell MC has a threshold voltage of not less than the voltage C2A and not more than the voltage C2B, then the memory cell MC is provided with second threshold voltage information "0". In addition, if a certain memory cell MC has a threshold voltage of not less than the voltage C2B and not more than the voltage D2A, then the memory cell MC is provided with second threshold voltage information "1".

For example, it is assumed here that a memory cell MC is read in a data-read operation and determined as retaining data of the threshold voltage distribution C. In addition, this memory cell MC is determined as "0" data in a second threshold-voltage-information read operation. In this case, it is likely that the memory cell MC indeed retains the data of the threshold voltage distribution C. On the other hand, if the memory cell MC is determined as "1" data in the second threshold-voltage-information read operation, it is determined that the memory cell MC actually stores data of the threshold voltage distribution B or D, and erroneously read as C.

In this case, using the first threshold voltage information read in the first threshold-voltage-information read operation, it can be determined that data corresponding to the threshold voltage distribution B is erroneously read as C, or data corresponding to the threshold voltage distribution C is erroneously read as C. In this way, an error check and correct operation may be performed using the second threshold voltage information in combination with the first threshold voltage information, further improving the accuracy of error check and correct operation.

Referring now to FIG. 12, specific procedures of the second threshold-voltage-information read operation according to this embodiment will be described below.

As illustrated in FIG. 12, when reading second threshold voltage information, the voltage values of read voltage applied to the selected word line WL may be set to fourteen different voltages A2A, A2B, B2A, B2B, . . . , G2A, and G2B. Once the second threshold-voltage-information read operation starts, the voltages A2A to G2B are sequentially applied to the word line WL in increasing order. In the second threshold-voltage-information read operation, the arithmetic circuit 31 performs logical operations similar to those illustrated in FIG. 11, the results of which are transferred to and retained in a data latch (e.g., the data latch DLX). As a result, "1" data or "0" data is determined as the second threshold voltage information based on the threshold voltage of the memory cell MC.

Figure 13A:
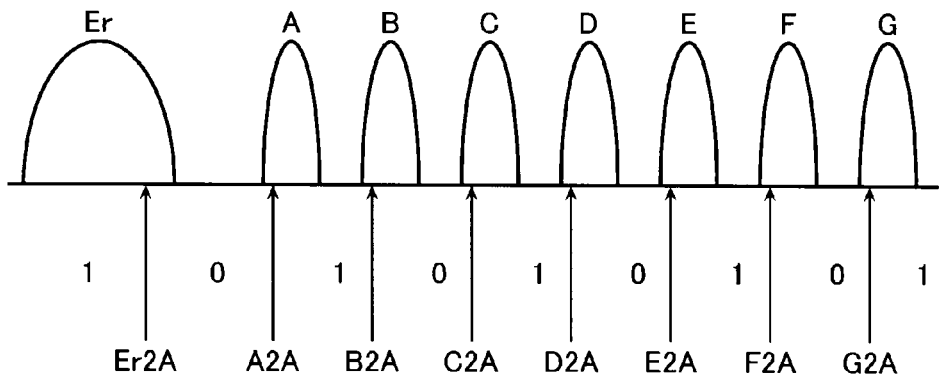
FIG. 13A illustrates the voltage applied to the word line of the selected memory cell when reading second threshold voltage information according to another example.
Figure 13B:
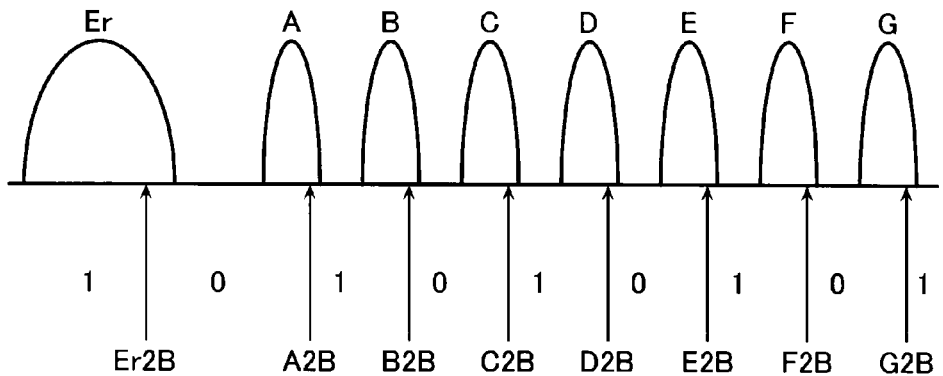
FIG. 13B illustrates the voltage applied to the word line of the selected memory cell when reading second threshold voltage information according to the other example.

Another example of the second threshold-voltage-information read operation according to this embodiment will now be described below. FIGS. 13A and 13B illustrate voltages applied to the word line of the selected memory cell MC in second threshold-voltage-information read operation according to the other example.

According to the other example of the second threshold-voltage-information read operation, voltage application operation is performed in two cycles. FIG. 13A illustrates voltages applied in the first cycle, and FIG. 13B illustrates those applied in the second cycle.

In the first cycle of voltage application operation, the voltages Er2A, A2A, B2A, C2A, D2A, E2A, F2A, and G2A are sequentially applied to the word line WL in increasing order. The voltage Er2A is decremented from the upper limit of the threshold voltage distribution Er in an erase state, by a voltage which is one-fourth of the width of Er. The voltages A2A, B2A, C2A, D2A, E2A, F2A, and G2A are incremented from the lower limits of seven different threshold voltage distributions A to G retained by the memory cell MC, respectively, by a voltage which is one-fourth of the width of A to G. With these voltages, a logical operation is performed at the arithmetic circuit 31 based on whether or not the memory cell MC becomes conductive, thereby determining data "1" or "0". For example, if a certain memory cell MC has a threshold voltage of not less than the voltage C2A and not more than the voltage D2A, then the memory cell MC is provided with data "1". In addition, if a certain memory cell MC has a threshold voltage of not less than the voltage D2A and not more than the voltage E2A, then the memory cell MC is provided with data "0".

Then, in the second cycle of voltage application operation, the voltages Er2B, A2B, B2B, C2B, D2B, E2B, F2B, and G2B are sequentially applied to the word line WL in increasing order. The voltage Er2B is decremented from the upper limit of the threshold voltage distribution Er in an erase state, by a voltage which is one-fourth of the width of Er. The voltages A2B, B2B, C2B, D2B, E2B, F2B, and G2B are decremented from the upper limits of seven different threshold voltage distributions A to G retained by the memory cell MC, respectively, by a voltage which is one-fourth of the width of A to G. With these voltages, a logical operation is performed at the arithmetic circuit 31 based on whether or not the memory cell MC becomes conductive, thereby determining data "1" or "0". For example, if a certain memory cell MC has a threshold voltage of not less than the voltage C2B and not more than the voltage D2B, then the memory cell MC is provided with data "1". In addition, if a certain memory cell MC has a threshold voltage of not less than the voltage D2B and not more than the voltage E2B, then the memory cell MC is provided with data "0".

After the two cycles of voltage application are completed, second threshold voltage information is determined from the data provided to the memory cell MC. This second threshold voltage information is determined by performing a logical XOR between the data read in the first cycle of voltage application and the data read in the second cycle. The same threshold voltage information can be read as in the second threshold-voltage-information read operation illustrated in FIG. 12, for example, by obtaining inverted data of XOR of data in the first cycle and data in the second cycle at the arithmetic circuit 31.

That is, for a memory cell MC from which "0" data has been read in both the two cycles of voltage application, "0" data which is XOR of "0" data and "0" data is inverted and second threshold voltage information is "1" is determined. Similarly, for a memory cell MC from which "1" data has been read in both the two cycles of voltage application, "0" data which is XOR of "1" data and "1" data is inverted and second threshold voltage information "1" is determined. On the other hand, for a memory cell MC from which "1" data and "0" data have been read in the two cycles of voltage application, "1" data which is XOR of "1" data and "0" data is inverted and second threshold voltage information "0" is determined.

Thereafter, the NAND-type flash memory according to this embodiment involves the above-mentioned collective data-read operation from three pages as well as first and second threshold-voltage-information read operations.

[Comparative Example of Data-Read and Threshold-Voltage-Information Read Operations]

Figure 14:
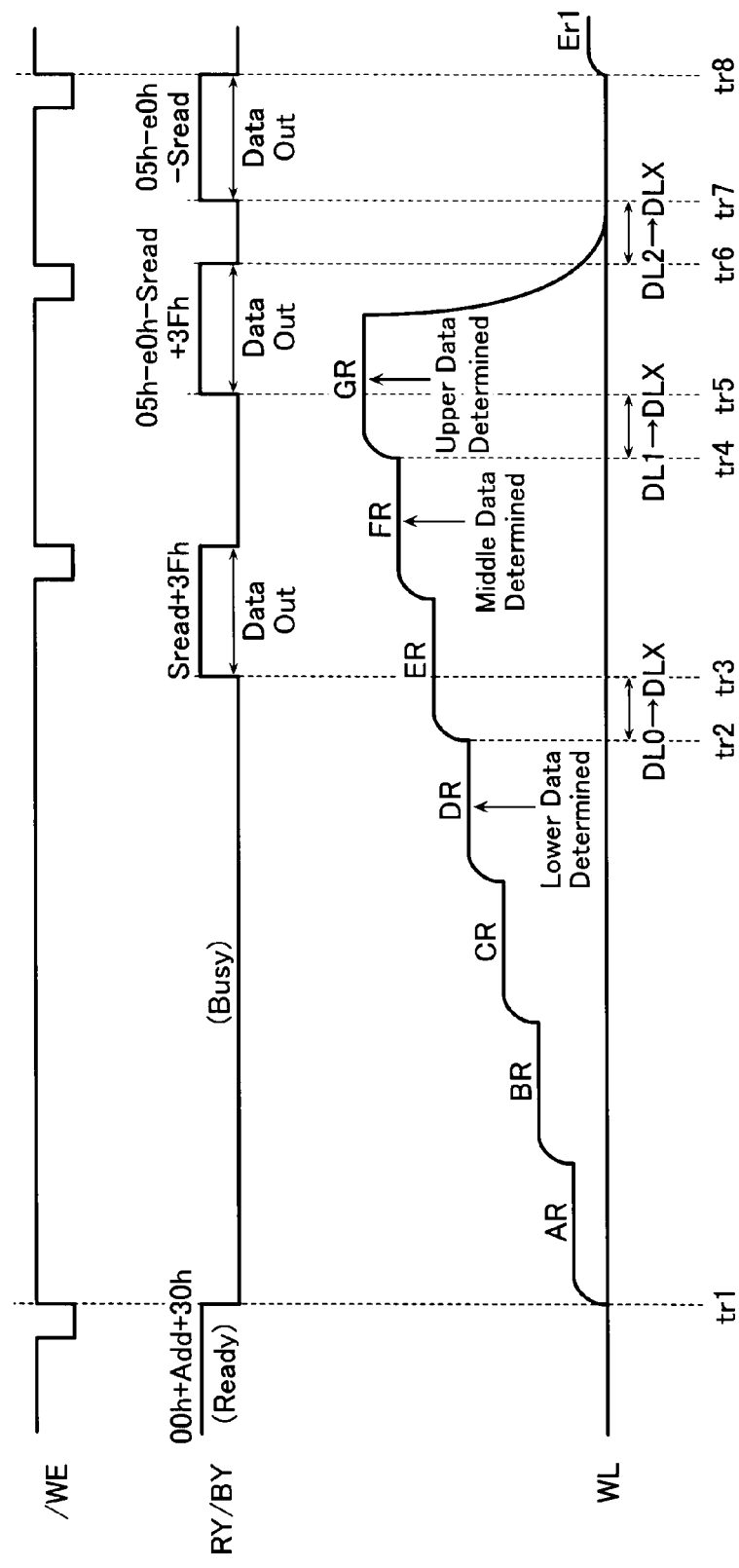
FIG. 14 illustrates a waveform of voltages applied to a word line and waveforms of signals for controlling data-read operation, where a data-read operation and first and second threshold-voltage-information read operations are performed.

Before explaining a data-read operation and a threshold-voltage-information read operation in the NAND-type flash memory of this embodiment, a data-read operation and a threshold-voltage-information read operation according to a comparative example will be discussed. FIG. 14 illustrates waveforms of signals for controlling data-read operation and a waveform of voltages applied to a word line, where a collective data-read operation from three pages is performed and a threshold-voltage-information read operation is performed after the collective read from three pages, according to a first comparative example.

At time tr1, a data-read operation starts in response to the commands, write-enable signals/WE, and Ready/Busy signals as illustrated in FIG. 14. As described above, the voltage values of read voltage applied to the selected word line in the data-read operation are set to voltages AR, BR, CR, DR, ER, FR, and GR (seven different voltages). Then, upon completion of the data read with the voltages AR to DR, data of the lower page LOWER is determined and retained in the data latch DL0.

At time tr2, the data of the lower page LOWER retained in the data latch DL0 is transferred to the data latch DLX as the data-read operation with the voltage DR is completed. Then, at time tr3, in response to a command 3Fh, the data is output to the outside from the data latch DLX through the data bus BUS. In FIG. 14, the time for outputting data from the data latch DLX to the outside is indicated by DataOut.

In this case, after the read operation with the read voltage DR, the switch SW2 is turned on to transfer the data in the data latch DL0 to the data latch DLX. Then, the data of the lower page LOWER can be output by turning the switch SW2 off and the switch SW1 on, and at the same time read operations with the read voltages ER, FR, and GR can be performed.

At time tr4, upon completion of the data read with the voltage FR, data of the middle page MIDDLE is determined and retained in the data latch DL1. The data of the middle page MIDDLE retained in the data latch DL1 is transferred to the data latch DLX as the data-read operation with the voltage FR is completed. At time tr5, in response to a command 3Fh, the data is output to the outside from the data latch DLX through the data bus BUS. As in the data of the lower page LOWER, the time for outputting data from the data latch DLX to the outside is indicated by DataOut.

Then, upon completion of the data read with the voltage GR, data of the upper page UPPER is determined and retained in the data latch DL2. At time tr6, the data of the upper page UPPER retained in the data latch DL2 is transferred to the data latch DLX as the transfer of the data of the middle page MIDDLE is completed. At time tr7, in response to a command 3Fh, the data is output to the outside from the data latch DLX through the data bus BUS. Thereafter, a first threshold-voltage-information read operation starts at time tr8, and then the voltages are sequentially applied, beginning with the voltage Er1. Then, a second threshold-voltage-information read operation is performed after reading the first threshold voltage information, although not illustrated.

According to this sequence control of a collective data-read operation from three pages and a threshold-voltage-information read operation after the collective read from three pages, transition to the threshold-voltage-information read operation may be performed as completion of the data-read operation, if the data output time DataOut for outputting data from the data latch DLX is short.

However, since the NAND-type flash memory involves a large amount of information per page, it may require a long data output time DataOut for outputting data from the data latch DLX.

Figure 15:
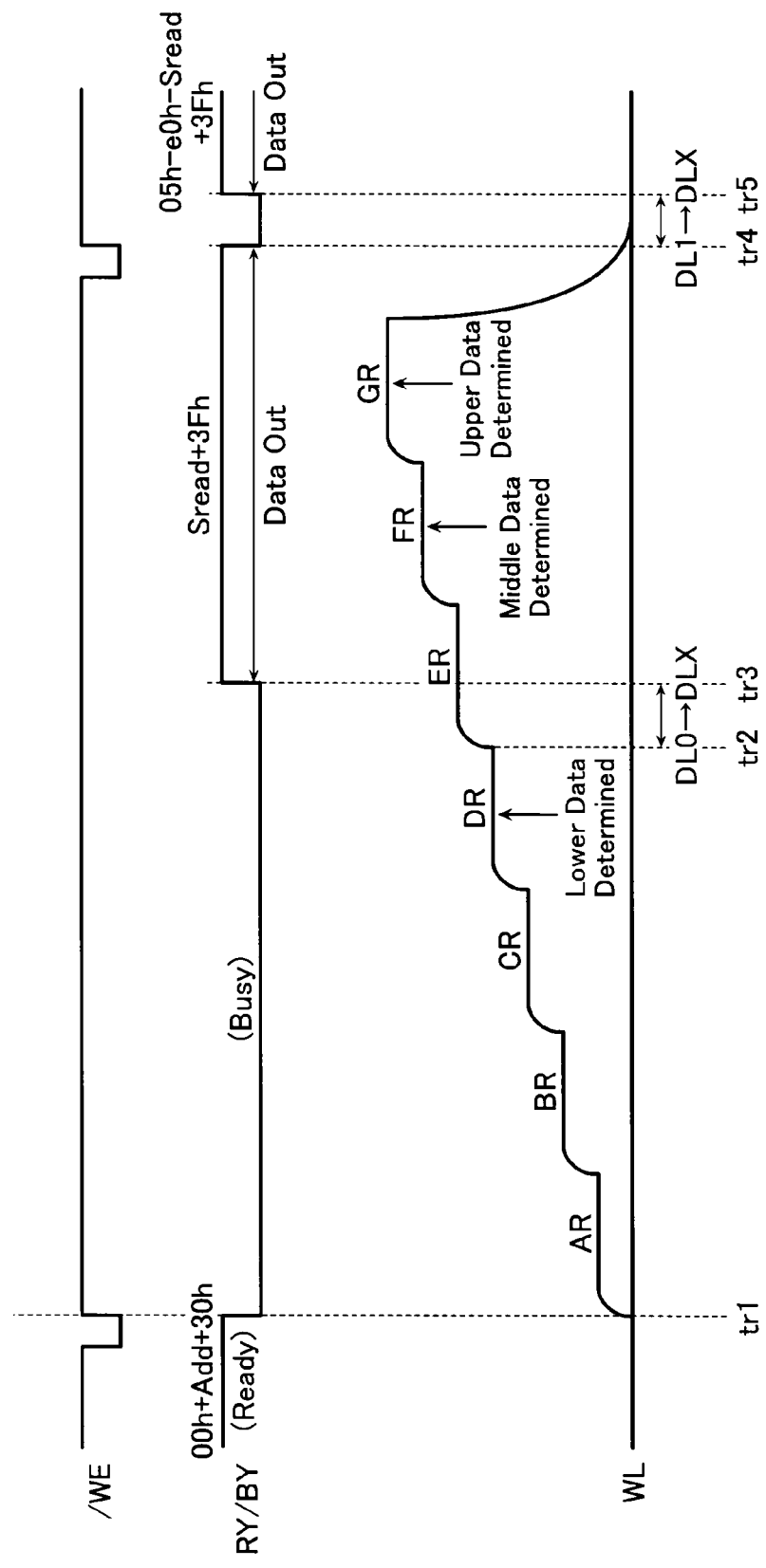
FIG. 15 illustrates a waveform of voltages applied to a word line and waveforms of signals for controlling data-read operation, where a data-read operation and first and second threshold-voltage-information read operations are performed according to a comparative example.

FIG. 15 illustrates a waveform of voltages applied to a word line and waveforms of signals for controlling data-read operation, where a collective data-read operation from three pages is performed and a threshold-voltage-information read operation is performed after the collective read from three pages, according to a second comparative example. FIG. 16 is a diagram for explaining the operations of respective parts, where a data-read operation and a threshold-voltage-information read operation are performed according to the waveforms illustrated in FIG. 15.

The data-read operation of FIG. 15 has a longer data output time DataOut than the data-read operation of FIG. 14 when outputting data from the data latch DLX to the outside.

As illustrated in FIGS. 15 and 16, at time tr2, after the read operation with the voltage DR, data LO of the lower page LOWER is transferred from the data latch DL0 to the data latch DLX. At time tr3, the data LO of the lower page LOWER is output to the outside via the interface (in this embodiment, the data bus BUS).

If it takes almost the same amount of time to output the data of the lower page LOWER as in the data-read operation with the voltages ER, FR, and GR, the data-read operation from the middle page MIDDLE and the upper page UPPER will be completed while outputting the data LO of the lower page LOWER from the data latch DLX. Data MI of the middle page MIDDLE and data UP of the upper page UPPER are retained in the respective data latches DL1 and DL2. After the data-read operation from all three pages is completed, at time tr4, the data MI of the middle page MIDDLE is transferred to the data latch DLX, which in turn outputs it to the outside. Thereafter, the data UP of the upper page UPPER is transferred to the data latch DLX, which in turn outputs it to the outside.

The data latch DLX is separated from the sense amplifier 3a while the data UP of the upper page UPPER is being output to the outside after transferred to the data latch DLX. In this case, any one of the data latches DL0 to DL2 may be used to start a first threshold-voltage-information read operation. In the second comparative example, neither a data-read operation nor a threshold-voltage-information read operation shall be performed while the data MI of the middle page MIDDLE is being output to the outside. Accordingly, the operating time may be increased by a time during which the data MI of the middle page MIDDLE is being output to the outside, which could increase the total amount of time for a data-read operation and a threshold-voltage-information read operation.

[Data Read and Threshold-Voltage-Information Read Operations in this Embodiment]

Figure 17:
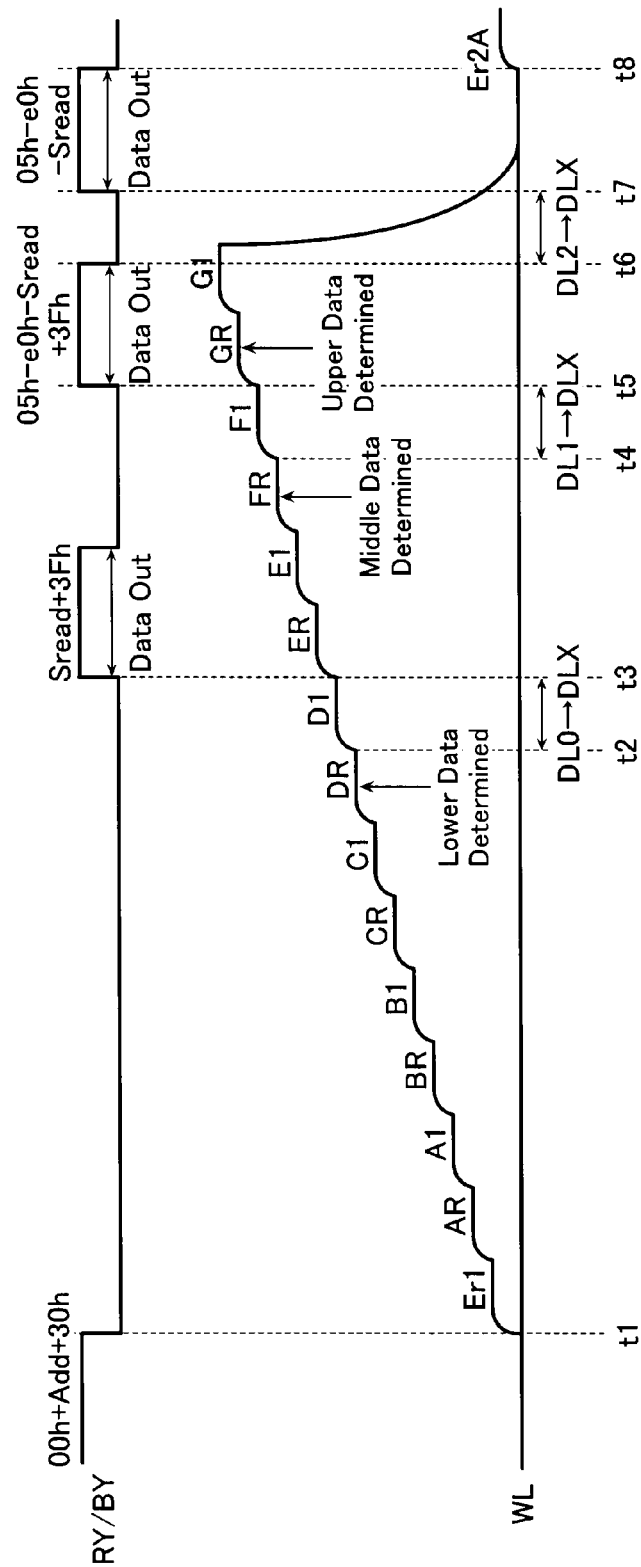
FIG. 17 illustrates a waveform of voltages applied to a word line and waveforms of signals for controlling data-read operation, where a data-read operation and first and second threshold-voltage-information read operations are performed according to a first embodiment.

A data-read operation and a threshold-voltage-information read operation according to this embodiment will now be described below. FIG. 17 illustrates a waveform of voltages applied to a word line WL and waveforms of signals for controlling data-read operation, where a collective data-read operation from three pages and a first threshold-voltage-information read operation are performed at the same time. FIG. 18 is a diagram for explaining the operations of respective parts, where a data-read operation and a threshold-voltage-information read operation are performed according to the waveforms illustrated in FIG. 17.

Upon initiation of the a data-read operation and a threshold-voltage-information read operation illustrated in FIG. 17, the following voltages are sequentially applied to the word line WL in increasing order: read voltages AR to GR that are applied to the selected word line WL when reading data; and voltages Er1 to G1 that are applied to the selected word line WL when reading threshold voltage information. It is assumed herein that data latches to retain read data are the data latches DL1, DL2, and DLX, and a data latch to retain threshold voltage information is the data latch DL0.

As illustrated in FIG. 18, after time t2 at which the read operation with the voltage DR is performed, at time t3, the data LO of the lower page LOWER is output to the outside from the data latch DLX via the interface (in this embodiment, the data bus BUS).

A first threshold-voltage-information read operation with the voltages D1 and E1 as well as a data-read operation with the voltage ER are performed while the data of the lower page LOWER is being output (during the output time DataOut). After the data LO of the lower page LOWER was output from the data latch DLX, the data-read operation from the middle page MIDDLE is completed after the data-read operation with the voltage FR is performed. At time t4, the data MI of the middle page MIDDLE is transferred from the data latch DL2 to the data latch DLX, and at time t5, it is transferred to the outside from the data latch DLX via the interface (in this embodiment, the data bus BUS).

In addition, a data-read operation with the voltage GR and a first threshold-voltage-information read operation with the voltage G1 are performed while the data of the middle page MIDDLE is being output (during the output time DataOut). As a result, the data read and first threshold-voltage-information read operations from the upper page UPPER are completed. In addition, first threshold voltage information SB1 is retained in the data latch DL0. At time t6, the data UP of the upper page UPPER is transferred from the data latch DL1 to the data latch DLX, and at time t7, it is output to the outside from the data latch DLX via the interface (in this embodiment, the data bus BUS).

The data latch DLX is separated from the sense amplifier 3a while the data of the upper page UPPER is being output to the outside after transferred to the data latch DLX. At this point, because the data-read operation and the operation for reading first threshold voltage information SB1 have already been completed, a second threshold-voltage-information read operation starts using the data latches DL0 to DL2.

As illustrated in FIG. 18, the first cycle of second threshold-voltage-information read operation is performed using, e.g., the data latch DL2 while the data UP of the upper page UPPER is being output to the outside.

In the first cycle of second threshold-voltage-information read operation, the voltages Er2A to G2A are applied to the selected word line WL and "1" or "0" data is retained in the data latch DL2.

After the data UP of the upper page UPPER was output to the outside, and upon completion of the first cycle of second threshold-voltage-information read operation, the first threshold voltage information SB1 retained in the data latch DL0 is transferred from the data latch DL0 to the data latch DLX, which in turn outputs it to the outside.

The data latch DLX is separated from the sense amplifier 3a while the first threshold voltage information SB1 is being output to the outside after transferred to the data latch DLX. At this point, the second cycle of second threshold-voltage-information read operation begins.

The second cycle of second threshold-voltage-information read operation is performed using, e.g., the data latch DL1 while the first threshold voltage information SB1 is being output to the outside. In the second cycle of second threshold-voltage-information read operation, the voltages Er2B to G2B are applied to the selected word line and "1" or "0" data is retained in the data latch DL1.

After the first threshold voltage information SB1 was output to the outside, and upon completion of the second cycle of second threshold-voltage-information read operation, second threshold voltage information SB2 is calculated from the data retained in the data latches DL1 and DL2. The second threshold voltage information SB2 is transferred to the data latch DLX, which in turn outputs it to the outside.

After the second threshold voltage information SB2 was output to the outside, an error check and correct operation is performed by the ECC circuit using the read data and the threshold voltage information. The data-read operation is completed as any errors in data are corrected.

[Advantages of Semiconductor Storage Device in this Embodiment]

The semiconductor storage device according to this embodiment performs data read and first threshold-voltageinformation read operations at the same time. Then, it may perform a second threshold-voltage-information read operation while outputting three pages of data LO, MI, and UP as well as the first threshold voltage information SB1 from the data register 3b to the outside. Therefore, no latency is introduced to the read operation from the memory cell array while the read data is being output to the outside. The semiconductor storage device of this embodiment may achieve high speed read and transfer of data and threshold voltage information from a memory cell array, improving the performance of the read operation.

Second Embodiment

Referring now to FIG. 19, a second embodiment of the present invention will be described below.

This embodiment is substantially the same as the first embodiment in the entire configuration of the semiconductor storage device, and so on (see FIGS. 1 to 6). However, it is different from the first embodiment in procedure (scheme) for reading data and threshold voltage information when performing a multi-value storage operation. In the following, the procedures for reading data and threshold voltage information will be described with reference to FIG. 19, while discussion of other elements will be omitted.

The data-read operation of this embodiment is different from that of the first embodiment in that the voltages will not be applied to a selected word line WL in increasing order (lower to higher) when reading data.

The data-read operation illustrated in FIG. 10 may perform data-read operation separately for each page because one data latch is provided for each page read operation. For example, as illustrated in FIG. 19, the voltage DR is applied to the selected word line to determine whether or not the memory cell MC becomes conductive. The resultant data is transferred to the data latch DLX, thereby determining data LO of the lower page LOWER.

After the read operation with the voltage DR, the data LO of the lower page LOWER is output to the outside from the data latch DLX via the interface (in this embodiment, the data bus BUS).

Data-read operations with the voltages BR and FR are performed while the data of the lower page LOWER is being output. While the data LO of the lower page LOWER is being output from the data latch DLX, the data-read operation from the middle page MIDDLE is completed after the data-read operations with the voltages BR and FR and the logical operation at the arithmetic circuit 31 are performed. The data MI of the middle page MIDDLE is retained in the data latch DL2. After the data LO of the lower page LOWER was output to the outside, the data MI of the middle page MIDDLE is transferred from the data latch DL2 to the data latch DLX, which in turn outputs it to the outside.

While the data of the middle page MIDDLE is being output, data-read operations with the voltages AR, CR, ER, and GR are performed. While the data MI of the middle page MIDDLE is being output from the data latch DLX, the data-read operation from the upper page UPPER is completed after the data-read operations with the voltages AR, CR, ER, and GR and the logical operation at the arithmetic circuit 31 are performed. The data UP of the upper page UPPER is retained in the data latch DL2. After the data MI of the middle page MIDDLE was output to the outside, the data of the upper page UPPER is transferred from the data latch DL2 to the data latch DLX, which in turn outputs it to the outside.

The data latch DLX is separated from the sense amplifier 3a while the data of the upper page UPPER is being output to the outside after transferred to the data latch DLX. At this point, because the data-read operation has already been completed, a first threshold-voltage-information read operation is started using any one of the data latches DL0 to DL2.

The first threshold-voltage-information read operation is performed using, e.g., the data latch DL2 while the data UP of the upper page UPPER is being output to the outside. In the first threshold-voltage-information read operation, the voltages Er1 to G1 are applied to the selected word line and "1" or "0" data is retained in the data latch DL2. Upon completion of the first threshold-voltage-information read operation, the resultant first threshold voltage information SB1 is transferred from the data latch DL2 to the data latch DLX, which in turn outputs it to the outside.

A second threshold-voltage-information read operation is performed while the first threshold voltage information SB1 is being output to the outside after transferred to the data latch DLX. This second threshold voltage read operation is substantially the same as that of the first embodiment, and description thereof will be omitted.

[Advantages of Semiconductor Storage Device in this Embodiment]

The semiconductor storage device according to this embodiment sequentially performs data-read operations, beginning with the lower page. Then, it may perform a first threshold-voltage-information read operation while outputting such data from a data register 3b to the outside that has been read from a memory cell array on a page-by-page basis. Again, the semiconductor storage device according to this embodiment will not introduce any latency into the read operation from the memory cell array 1 that would otherwise be introduced in the comparative example of the first embodiment. The semiconductor storage device of this embodiment may also achieve high speed read and transfer of data and threshold voltage information from a memory cell array, improving the performance of the read operation.

[Others]

While embodiments of the present invention have been described, the present invention is not intended to be limited to the disclosed embodiments and various other changes, additions or the like may be made thereto without departing from the spirit of the invention. For example, the above embodiments have been described in the context of 3 bits of data being stored in one memory cell MC for the purpose of illustration, the present invention is not so limited and may equally be applicable to a case where multiple bits of data (such as 4-value or 16-value data) are stored in one memory cell MC.

What is claimed is:

1. A semiconductor storage device comprising:
a memory cell array having a plurality of memory cells, each of the memory cells capable of storing multiple bits of information allocated to a plurality of threshold voltage distributions;
a sense amplifier circuit configured to read data stored in the memory cell as well as threshold voltage information indicative of at which position a threshold voltage of the memory cell is positioned in one of the plurality of threshold voltage distributions;
a first data retaining circuit configured to retain the data and the threshold voltage information read from the memory cell;
a second data retaining circuit configured to retain the data and the threshold voltage information read from the memory cell, and output the data and the threshold voltage information to an outside circuit; and a control circuit configured to control read, write, and erase operations on the memory cell array, the sense amplifier circuit being configured to perform a data-read operation and a threshold-voltage-information read operation at the same time by a series of voltage application operations to a word line connected to the memory cell, the control circuit being configured to control read operations so that either one of the data or the threshold voltage information for which a read operation is finished earlier is output from the second data retaining circuit, and the other one of the data or the threshold voltage information for which a read operation is not finished yet is read from the memory cell array and retained in the first data retaining circuit.

2. The semiconductor storage device according to claim 1, wherein
the sense amplifier circuit is configured to perform the data-read operation and the threshold-voltage-information read operation at the same time by sequentially increasing values of voltage applied to the word line.

3. The semiconductor storage device according to claim 1, wherein
the sense amplifier circuit is configured to perform the threshold-voltage-information read operation by applying respective intermediate voltages between both ends of the plurality of threshold voltage distributions.

4. The semiconductor storage device according to claim 1, wherein
the sense amplifier circuit is configured to perform the threshold-voltage-information read operation by applying a voltage that is decremented from an upper limit of each of the plurality of threshold voltage distributions by a voltage with one-fourth of a width of each of the threshold voltage distributions, and a voltage that is incremented from a lower limit of each of the threshold voltage distributions by a voltage with one-fourth of the width of each of the threshold voltage distributions.

5. The semiconductor storage device according to claim 1, further comprising an ECC circuit configured to correct data read from the memory cell array based on the threshold voltage information and redundant data.

6. The semiconductor storage device according to claim 1, wherein
the control circuit is configured to control read operations so that a part of the data or the threshold voltage information is retained in the second data retaining circuit and output the data or the threshold voltage information to the outside when performing the data-read operation and the threshold-voltage-information read operation.

7. The semiconductor storage device according to claim 1, further comprising an arithmetic circuit configured to perform a logical operation between data detected by the sense amplifier circuit and data retained by the first data retaining circuit or the second data retaining circuit, and transfer the operation result to the first data retaining circuit or the second data retaining circuit.

8. The semiconductor storage device according to claim 7, wherein
a plurality of the first data retaining circuits are provided, and
the arithmetic circuit is configured to perform the logical operation on data retained by the plurality of the first data retaining circuits.

9. A semiconductor storage device comprising:
a memory cell array having a plurality of memory cells, each of the memory cells capable of storing multiple bits of information allocated to a plurality of threshold voltage distributions;
a sense amplifier circuit configured to read data stored in the memory cell as well as threshold voltage information indicative of at which position a threshold voltage of the memory cell is positioned in one of the plurality of threshold voltage distributions;
a first data retaining circuit configured to retain the data and the threshold voltage information read from the memory cell;
a second data retaining circuit configured to retain the data and the threshold voltage information read from the memory cell, and output the data and the threshold voltage information to an outside circuit; and
a control circuit configured to control read, write, and erase operations on the memory cell array,
the memory cell storing multiple pages of information corresponding to the multiple bits of information,
the sense amplifier circuit being configured to perform a data-read operation on a page-by-page basis by applying a voltage to a word line connected to the memory cell, and
the control circuit being configured to control a read operation so that the data is output from the second data retaining circuit, and the threshold voltage information is read from the memory cell array and retained in the first data retaining circuit.

10. The semiconductor storage device according to claim 9, wherein
the sense amplifier circuit is configured to perform a threshold-voltage-information read operation by applying respective intermediate voltages between both ends of the plurality of threshold voltage distributions.

11. The semiconductor storage device according to claim 9, wherein
the sense amplifier circuit is configured to perform a threshold-voltage-information read operation by applying a voltage that is decremented from an upper limit of each of the plurality of threshold voltage distributions by a voltage with one-fourth of a width of each of the threshold voltage distributions, and a voltage that is incremented from a lower limit of each of the threshold voltage distributions by a voltage with one-fourth of the width of each of the threshold voltage distributions.

12. The semiconductor storage device according to claim 9, further comprising an ECC circuit configured to correct data read from the memory cell array based on the threshold voltage information and redundant data.

13. The semiconductor storage device according to claim 9, wherein
the control circuit is configured to control the read operation so that a part of the data is retained in the second data retaining circuit and output the data and the threshold voltage information to the outside circuit when performing the data-read operation.

14. The semiconductor storage device according to claim 9, further comprising an arithmetic circuit configured to perform a logical operation between data detected by the sense amplifier circuit and data retained by the first data retaining circuit or the second data retaining circuit, and transfer the operation result to the first data retaining circuit or the second data retaining circuit.

15. The semiconductor storage device according to claim 14, wherein a plurality of the first data retaining circuits are provided, and the arithmetic circuit is configured to perform logical operation on data retained by the plurality of the first data retaining circuits.

16. A semiconductor storage device comprising:

a memory cell array having a plurality of memory cells, each of the memory cells capable of storing multiple bits of information allocated to a plurality of threshold voltage distributions;

a sense amplifier circuit configured to read data stored in the memory cell as well as threshold voltage information indicative of where a threshold voltage of the memory cell is positioned in one of the plurality of threshold voltage distributions;

a first data retaining circuit configured to retain the data and the threshold voltage information read from the memory cell;

a second data retaining circuit configured to retain the data and the threshold voltage information read from the memory cell, and output the data and the threshold voltage information to an outside circuit; and a control circuit configured to control read, write, and erase operations on the memory cell array, the sense amplifier circuit being configured to perform a data-read operation by applying a voltage to a word line connected to the memory cell, and the control circuit being configured to control a read operation so that the data is output from the second data retaining circuit, and threshold voltage information is read from the memory cell array and retained in the first data retaining circuit.

17. The semiconductor storage device according to claim 16, wherein the sense amplifier circuit is configured to perform a threshold-voltage-information read operation by applying respective intermediate voltages between both ends of the plurality of threshold voltage distributions.

18. The semiconductor storage device according to claim 16, wherein the sense amplifier circuit is configured to perform a threshold-voltage-information read operation by applying a voltage that is decremented from an upper limit of each of the plurality of threshold voltage distributions by a voltage with one-fourth of a width of each of the threshold voltage distributions, and a voltage that is incremented from a lower limit of each of the threshold voltage distributions by a voltage with one-fourth of width of each of the threshold voltage distributions.

19. The semiconductor storage device according to claim 16, further comprising an ECC circuit configured to correct data read from the memory cell array based on the threshold voltage information and redundant data.

20. The semiconductor storage device according to claim 16, further comprising an arithmetic circuit configured to perform a logical operation between data detected by the sense amplifier circuit and data retained by the first data retaining circuit or the second data retaining circuit, and transfer the operation result to the first data retaining circuit or the second data retaining circuit.

* * * * *